United States Patent
Chen et al.

(10) Patent No.: US 11,545,583 B2
(45) Date of Patent: Jan. 3, 2023

(54) PROCESS OF FORMING AN ELECTRONIC DEVICE INCLUDING A NON-VOLATILE MEMORY CELL

(71) Applicant: Semiconductor Components Industries, LLC, Phoenix, AZ (US)

(72) Inventors: Weize Chen, Phoenix, AZ (US); Sameer S. Haddad, San Jose, CA (US); Bruce B. Greenwood, Gresham, OR (US); Mark Griswold, Gilbert, AZ (US); Kenneth A. Bates, Happy Valley, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/248,750

(22) Filed: Feb. 5, 2021

(65) Prior Publication Data

US 2022/0254920 A1 Aug. 11, 2022

(51) Int. Cl.
*H01L 29/788* (2006.01)
*H01L 29/423* (2006.01)
*H01L 29/66* (2006.01)
*H01L 29/49* (2006.01)

(52) U.S. Cl.
CPC ...... *H01L 29/788* (2013.01); *H01L 29/42324* (2013.01); *H01L 29/4933* (2013.01); *H01L 29/66825* (2013.01)

(58) Field of Classification Search
CPC .............. H01L 27/11521; H01L 27/11526
See application file for complete search history.

(56) References Cited

U.S. PATENT DOCUMENTS

| | | | |
|---|---|---|---|
| 10,153,213 B2 | 12/2018 | Agam et al. | |
| 2004/0065917 A1 | 4/2004 | Fan et al. | |
| 2005/0207199 A1 | 9/2005 | Chen et al. | |
| 2008/0121975 A1 | 5/2008 | Hsieh et al. | |
| 2008/0122025 A1 | 5/2008 | Roggenbauer et al. | |
| 2010/0054043 A1 | 3/2010 | Liu et al. | |
| 2010/0283101 A1* | 11/2010 | Chen | B82Y 10/00 257/E21.24 |
| 2014/0050029 A1* | 2/2014 | Kang | H01L 29/40114 365/185.23 |

(Continued)

OTHER PUBLICATIONS

Pak et al. "40nm & 22 nm Embedded Charge Trap Flash for Automotive Applications"; 2018 IEEE International Mlemory Workshop; IEEE, pp. 1-4 (2018).

(Continued)

*Primary Examiner* — Xiaoming Liu
(74) *Attorney, Agent, or Firm* — Abel Schillinger, LLP

(57) ABSTRACT

An electronic device can include a NVM cell. The NVM cell can include a drain/source region, a source/drain region, a floating gate electrode, a control gate electrode, and a select gate electrode. The NVM cell can be fabricated using a process flow that also forms a power transistor, high-voltage transistors, and low-voltage transistors on the same die. A relatively small size for the NVM can be formed using a hard mask to define a gate stack and spacer between gate stack and select gate electrode. A gate dielectric layer can be used for the select gate electrode and transistors in a low-voltage region and allows for a fast read access time.

19 Claims, 7 Drawing Sheets

(56) References Cited

U.S. PATENT DOCUMENTS

| | | |
|---|---|---|
| 2014/0097480 A1 | 4/2014 | Shum et al. |
| 2014/0217489 A1 | 8/2014 | Wang et al. |
| 2016/0126327 A1 | 5/2016 | Chen et al. |
| 2018/0254281 A1 | 9/2018 | Bo et al. |
| 2020/0161318 A1* | 5/2020 | Bo .................... G11C 16/0425 |
| 2021/0005725 A1* | 1/2021 | Xing .................. H01L 29/7883 |

OTHER PUBLICATIONS

F. Driussi; "Split Gate NVM Cells"; Ihttp://www.diegm.uniud.it/driussi/biografia/dottorato/node8.html; pp. 1-3 (2004).

\* cited by examiner

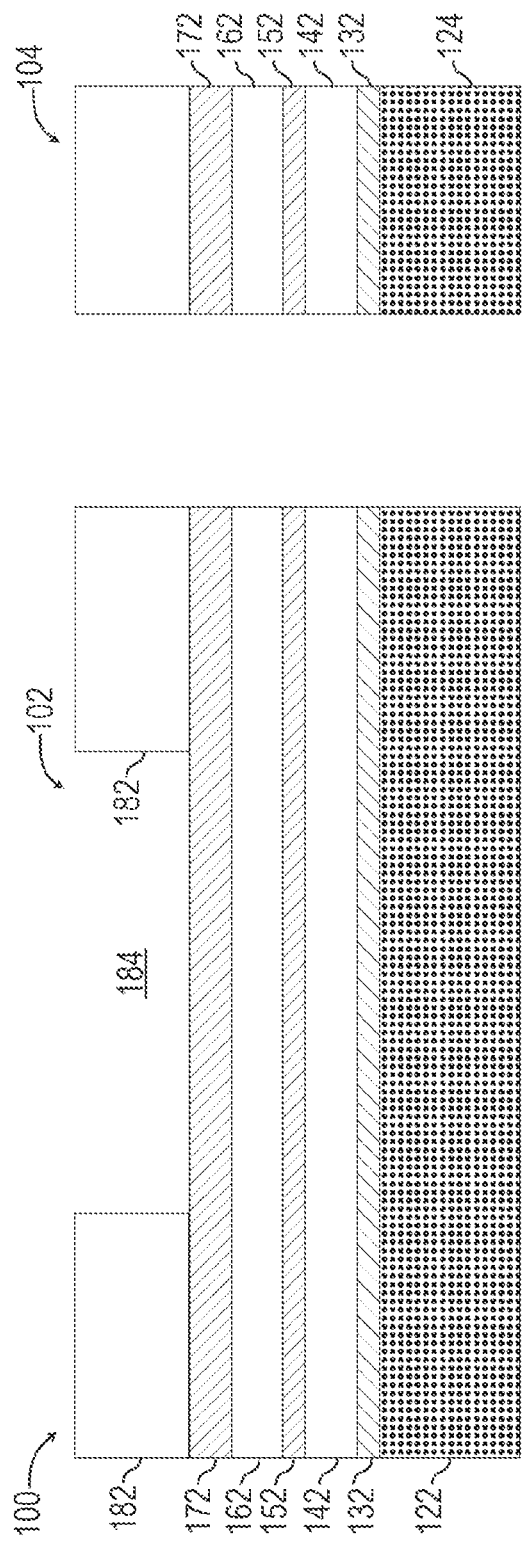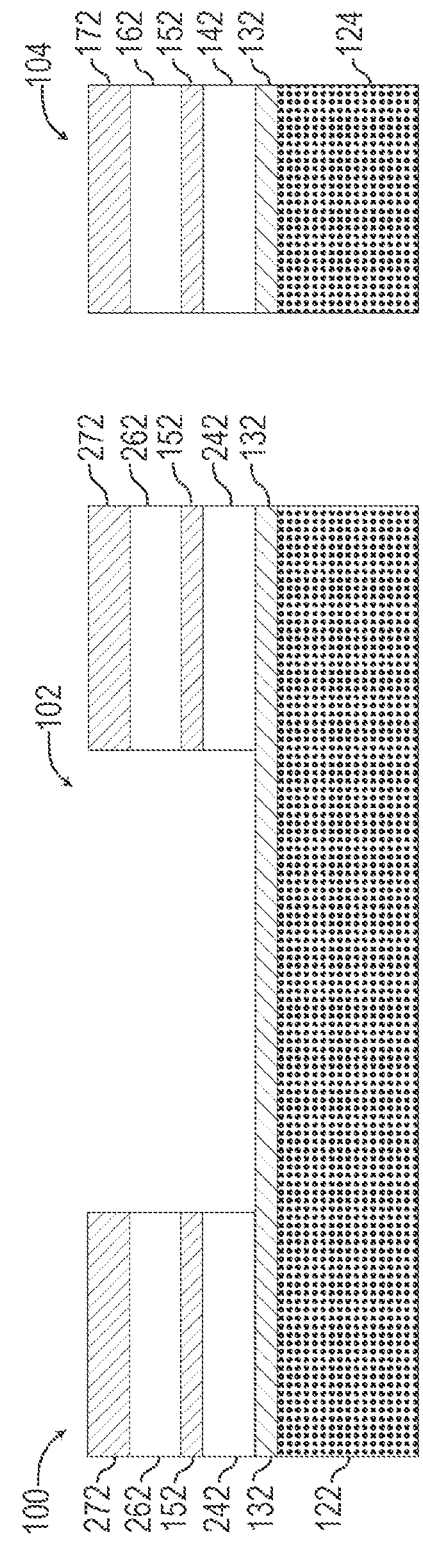

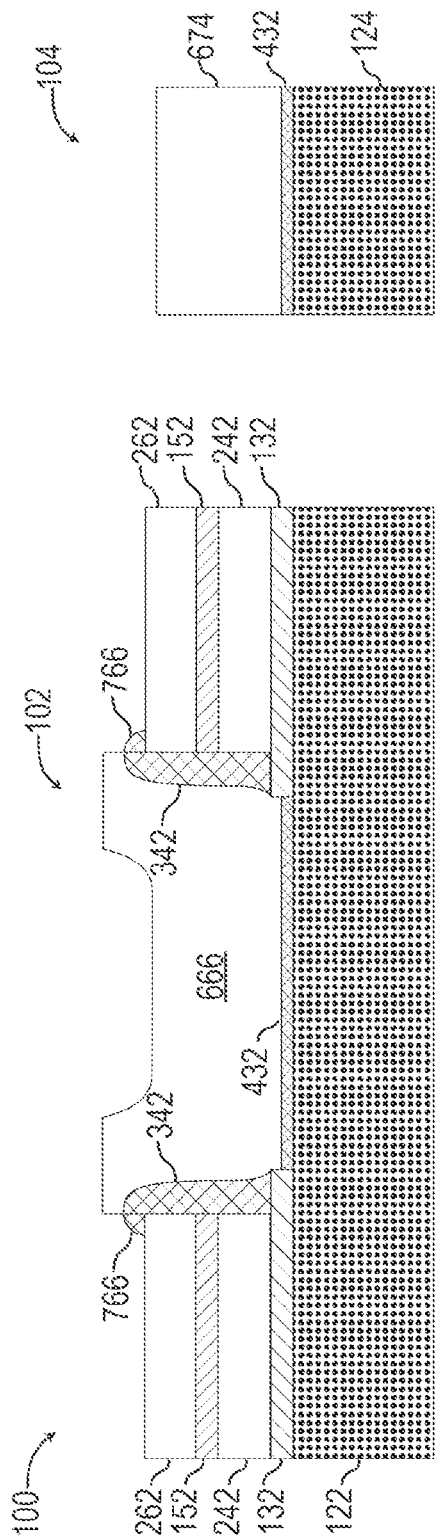
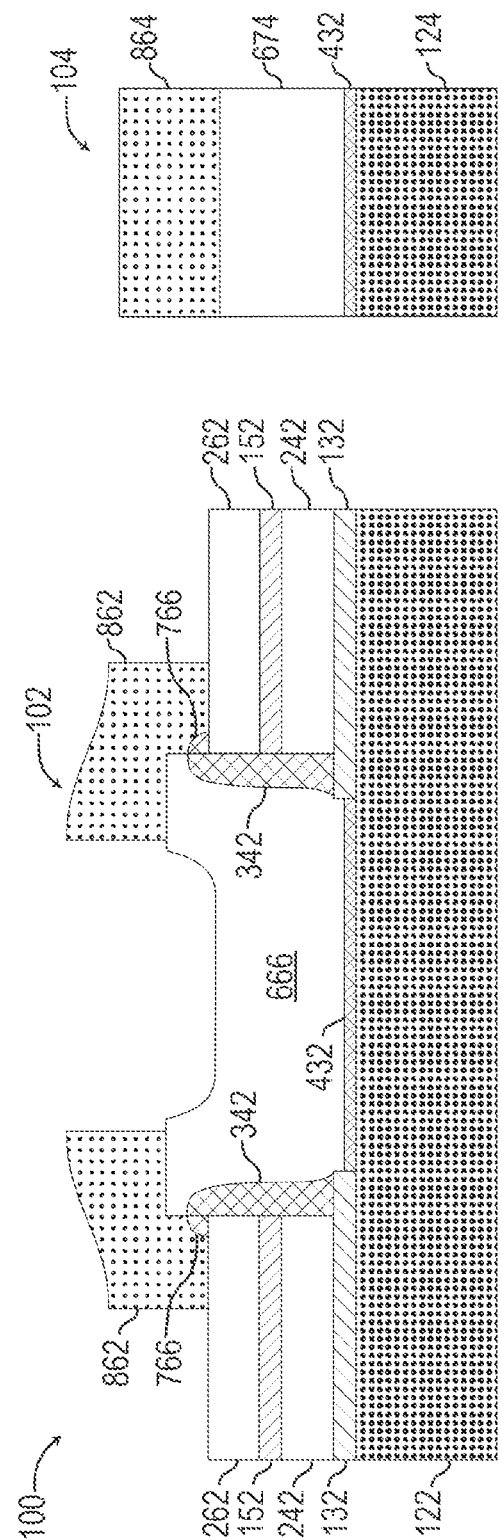
FIG. 7
FIG. 8

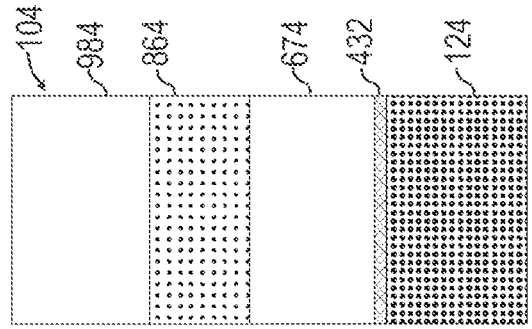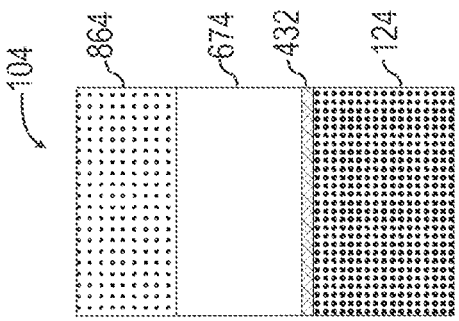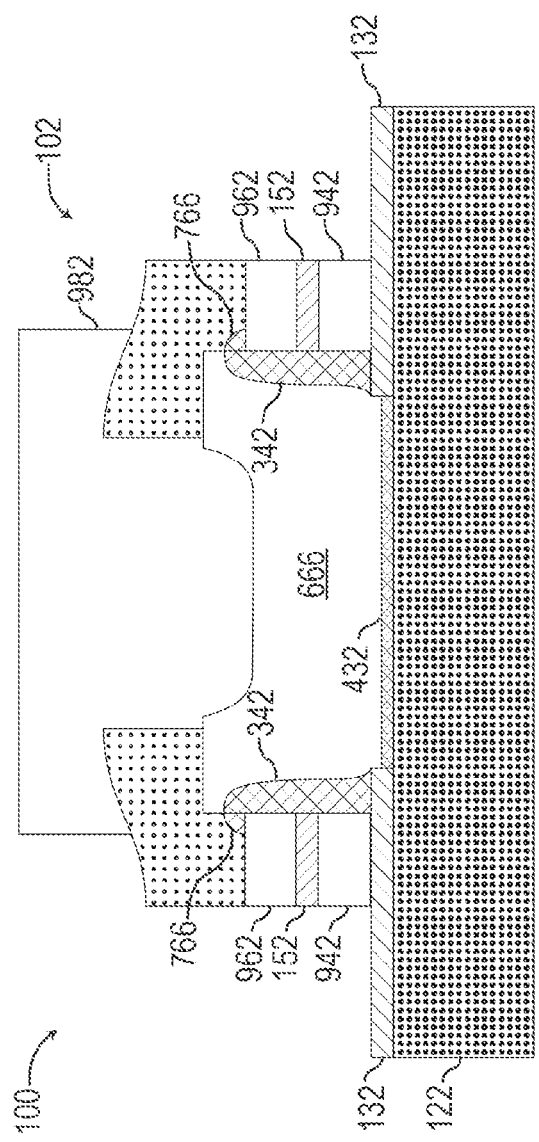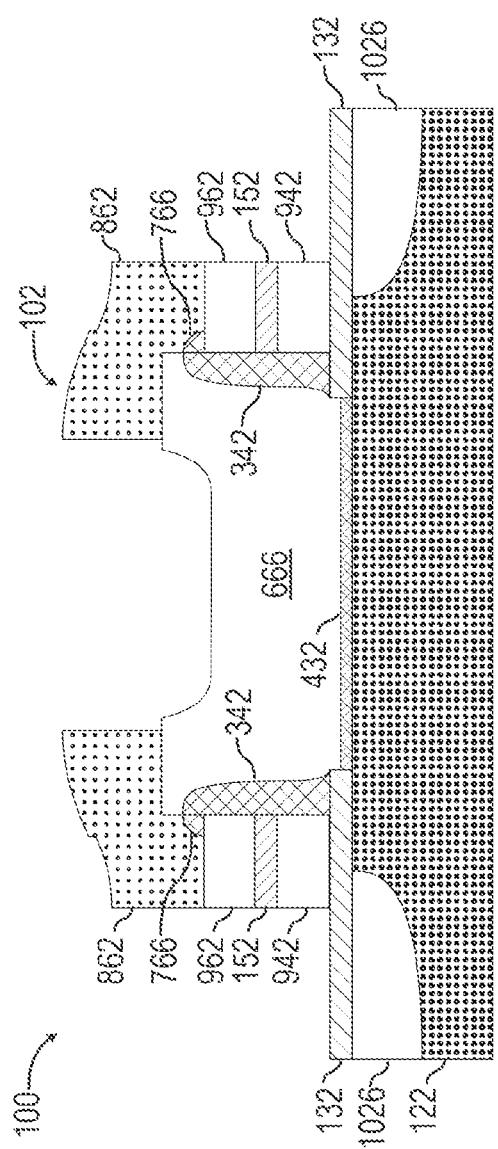

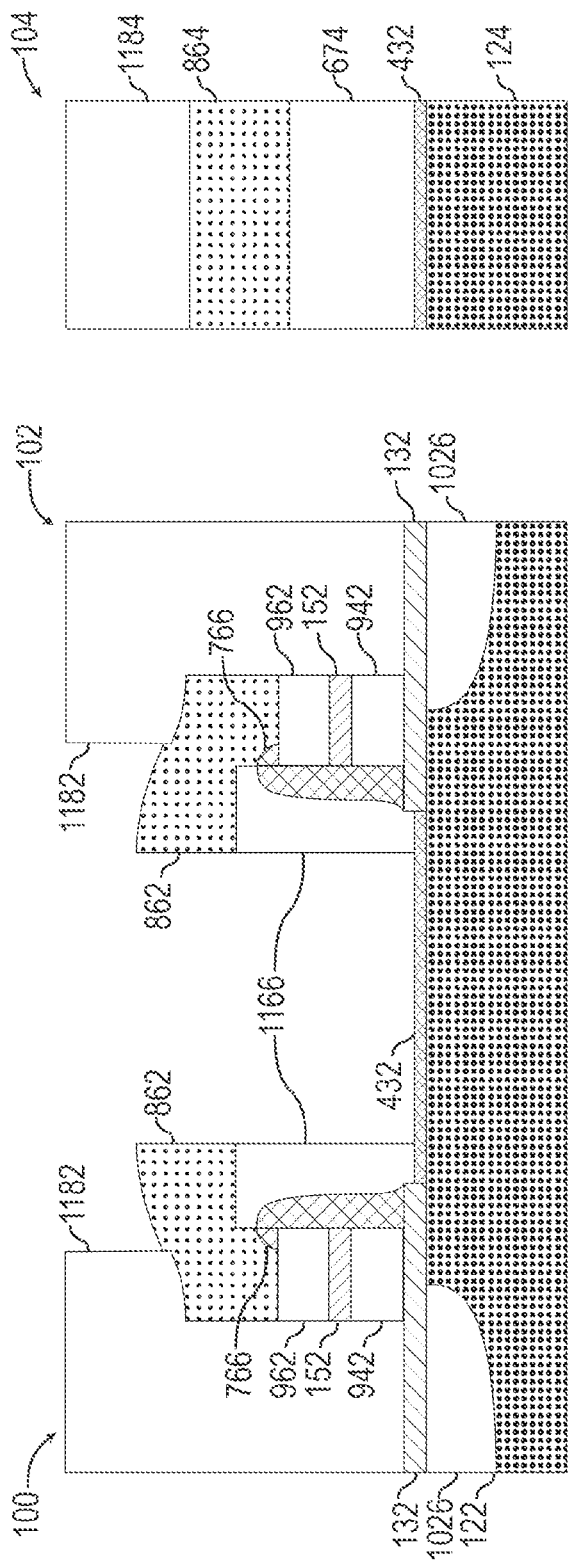
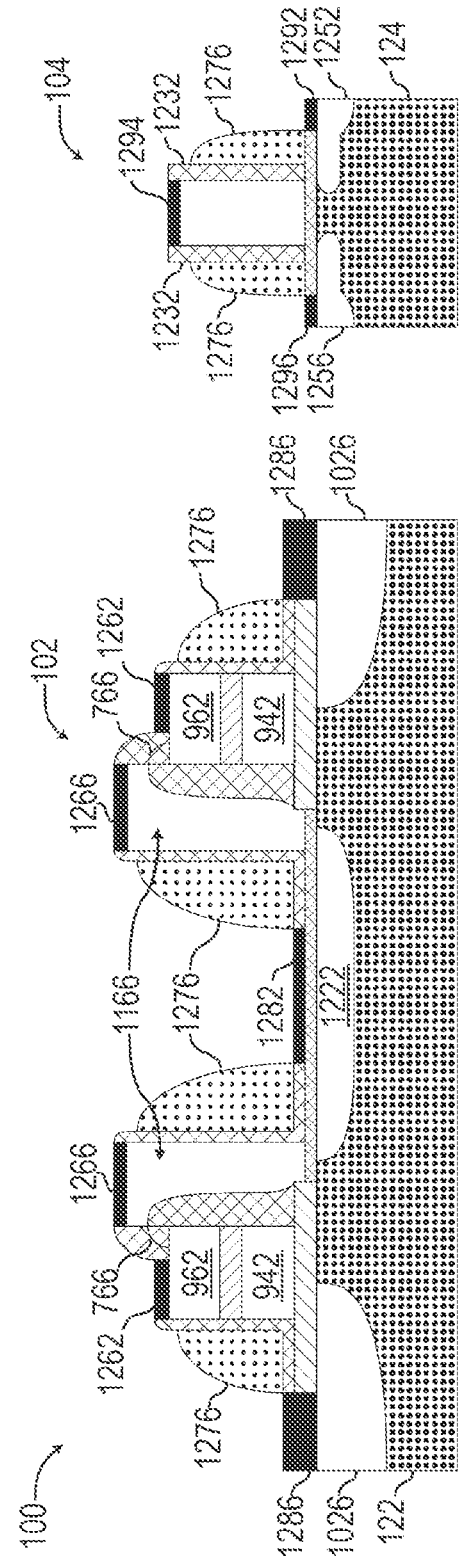
FIG. 11
FIG. 12

PROCESS OF FORMING AN ELECTRONIC DEVICE INCLUDING A NON-VOLATILE MEMORY CELL

FIELD OF THE DISCLOSURE

The present disclosure relates to electronic devices and processes of forming the electronic devices, and more particularly to, electronic devices that include non-volatile memory cells and processes of forming the electronic devices.

RELATED ART

High performance embedded flash memory is becoming more important to many advanced analog/digital systems. Embedded nonvolatile memory technology should evolve with the technology for other devices on the same die to compete effectively in view of products of competitors. Split gate technology has become the technology of choice for many. Challenges exist to integrate a robust nonvolatile memory array within a process flow that is also used to form power and logic transistors on the same die without adding too many process operations that are unique to the nonvolatile memory array. Further improvements to address process integration are desired.

BRIEF DESCRIPTION OF THE DRAWINGS

Embodiments are illustrated by way of example and are not limited in the accompanying figures.

FIG. 1 includes an illustration of cross-sectional views of portions of a workpiece that include portions of a non-volatile memory array and a low-voltage transistor after forming layers for gate stacks and a patterned resist layer.

FIG. 2 includes an illustration of cross-sectional views of the workpiece of FIG. 1 after patterning the layers to form gate stacks and removing the patterned resist layer.

FIG. 7 includes an illustration of cross-sectional views of the workpiece of FIG. 6 after forming optional spacers adjacent to select gate members.

FIG. 8 includes an illustration of cross-sectional views of the workpiece of FIG. 7 after forming a patterned hard mask layer used in defining floating, control, and select gate electrodes.

FIG. 9 includes an illustration of cross-sectional views of the workpiece of FIG. 8 after defining the gate stacks and doping for source/drain regions.

FIG. 10 includes an illustration of cross-sectional views of the workpiece of FIG. 9 after annealing to activate dopant for the source/drain regions.

FIG. 11 includes an illustration of cross-sectional views of the workpiece of FIG. 10 after defining the select gate electrodes and doping for drain/source regions.

FIG. 12 includes an illustration of cross-sectional views of the workpiece of FIG. 11 after defining gate electrodes for transistors outside of the nonvolatile memory array, forming doped regions for source and drain regions for transistors outside the nonvolatile memory array, and annealing to activate dopant for the drain/source regions.

Figure 3:
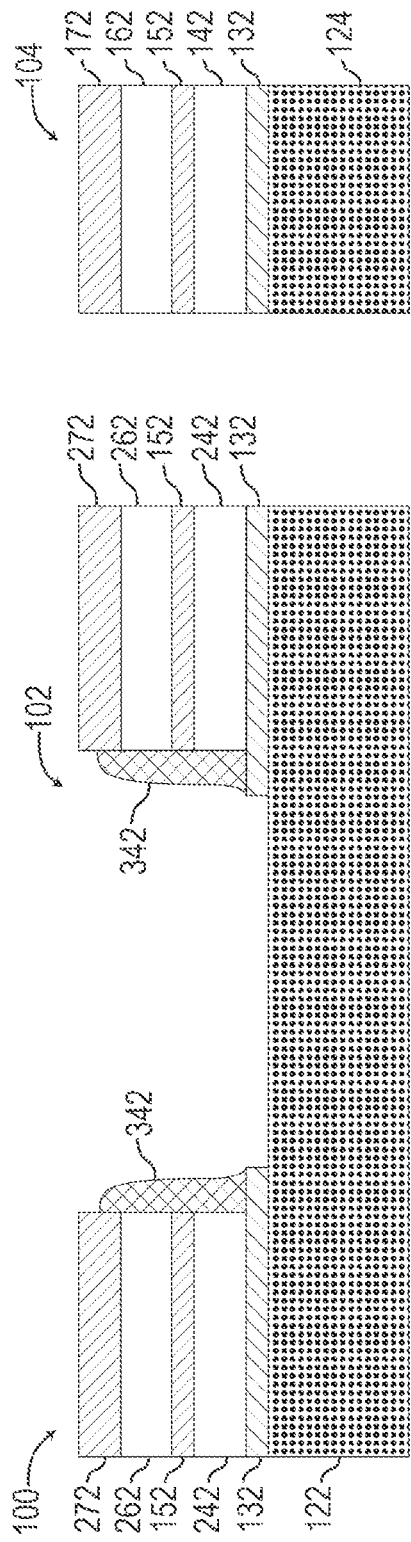
FIG. 3 includes an illustration of cross-sectional views of the workpiece of FIG. 2 after forming spacers adjacent to the gate stacks.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "bridging" is intended to mean that features that are designed to be spaced apart from each other contact each other or are sufficiently close enough to each other to form an electrical short or a significant, undesired conduction path.

The term "high-voltage transistor" is intended to mean a transistor that is designed such that voltages between any of a source or emitter region, a gate electrode or a base region, and a drain or collector region is more than 5 V from 0 V (lower than −5 V or higher than +5 V) when normally operating at steady state. The high-voltage transistor may or may be not a power transistor.

The term "low-voltage" transistor is intended to mean a transistor that is designed such that voltages between any of a source or emitter region, a gate electrode or a base region, and a drain or collector region is within 5 V of 0 V (i.e., in a range from −5 V to +5 V) when normally operating at steady state, and current flowing through the transistor is less than 0.1 A when the transistor is in the on-state.

The term "member" is intended to mean a feature that is in an intermediate state or final state in an electrical device. A gate member can be a gate electrode. Alternatively, a gate member can be a feature that is further patterned to form a gate electrode.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "power transistor" is intended to mean a transistor that is designed to normally flow at least 0.1 A of current when the transistor is in an on-state.

The term "steady state" refers to a state in which operation of a circuit or a component within a circuit does not significantly change with time. The term "transient state" refers to a state in which operation of a circuit or a component within a circuit significantly changes with time. For example, a voltage at a node within the circuit may be fluctuating such that voltage swings decrease in amplitude over time, and may be referred to as ringing. After a period of time, a voltage swing becomes insignificant because the amplitude of the voltage swing is a small fraction of the initial amplitude. Thus, the circuit can be in a transient state during ringing and can be at steady state after the ringing becomes insignificant.

Group numbers correspond to columns within the Periodic Table of Elements based on the IUPAC Periodic Table of Elements, version dated Dec. 1, 2018.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not explicitly listed or inherent to such method, article, or apparatus. Further, unless explicitly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a nonvolatile memory (NVM) cell. The NVM cell can include a drain/source region, a source/drain region, a floating gate electrode or another charge storage member, a control gate electrode, and a select gate electrode. The NVM cell can be fabricated using a process flow that is well suited to an existing process flow for electronic devices that include at least one power transistor, at least one high-voltage transistor, at least one low-voltage transistor, or a combination of power, high voltage transistors, or low-voltage transistors, or any combination thereof. In embodiments described below, the electronic device and its process flow is described with a power transistor, high-voltage transistors, and low-voltage transistors present. The power transistor, the high-voltage transistors, or the low-voltage transistors may not be present in all embodiments. The power transistor, the high-voltage transistors, or the low-voltage transistors may not be used or may be part of a different electronic device.

In an embodiment, the process flow as described herein allows the gate dielectric layer under the select gate electrodes of the NVM cells to be formed during the same operation when forming the gate dielectric layer for the low-voltage transistors. Thus, the NVM cells can have a faster read access time.

The NVM cells as described herein do not have a separate, dedicated erase electrode. Thus, the cell size of the NVM cells can be kept reasonably small. The gate stacks that include the floating and control gate stacks can be patterned using a hard mask that can help to reduce floating gate-to-select gate misalignment and allow gate lengths within the NVM cells that are smaller than the minimum feature corresponding to the smallest feature size defined by a photoresist mask. An optional spacer near tops of the control and select gate electrodes can help to reduce the likelihood of bridging between silicide members over the control and select gate electrodes.

In an aspect, a process of forming an electronic device can include forming a first gate member over a substrate; forming a first process-stop member over the first gate member; forming a gate electrode layer over the first gate member, the first process-stop member and a portion of the substrate not covered by the first gate member and the first process-stop member; forming a second process-stop member over the gate electrode layer, wherein the second process-stop does not cover the first gate member and first process-stop member; and removing a portion of the gate electrode layer to expose the first process-stop member to form a second conductive member that does not contact the first gate member.

In another aspect, an electronic device can include a NVM cell including a drain/source region; a source/drain region; a charge storage member that is closer to the source/drain region than to the drain/source region; a control gate electrode overlying the charge storage member; a first silicide member over the control gate electrode; a select gate electrode that is closer to the drain/source region than to the source/drain region; a second silicide member over the select gate electrode; and a spacer that is disposed between the first silicide member and the second silicide member.

In a further aspect, a process of forming an electronic device can include forming a first gate member over a substrate, wherein the first gate member has a proximal side; forming a second gate member having a proximal side adjacent to the proximal side of the first gate member; forming a mask member over portions of the first gate member and the second gate member, wherein the mask member overlies the proximal sides of the first gate member and the second gate member; removing an exposed portion of the first gate member that is not covered by the mask member to form a first gate electrode having a distal side that is opposite the proximal side; and removing an exposed portion of the second gate member that is not covered by the mask member to form a second gate electrode having a distal side that is opposite the proximal side.

An electronic device may be formed using a substrate. The isolation used within the electronic device may depend on the type of power transistor used in the electronic device. For a laterally diffused metal-oxide-semiconductor (LD-MOS) transistors and other planar power transistors, shallow trench isolation (for example, isolation that extends at most 1 micron below the primary surface) and high voltage well dopant regions may be used to isolate the power transistor from NVM cells within an NVM array and low-voltage transistors within a control portion of the electronic device. For a vertical power transistor, such as a vertical field-effect transistor or an insulated-gate bipolar transistor (IGBT), where current principally flows between the primary surface and a substrate, deep trench isolation (isolation that extends more than 1 micron below the primary surface) may be used. After reading this specification, skilled artisans will be able to determine an isolation scheme for the electronic device depending on the needs or desires for a particular application.

FIG. 1 includes a cross-sectional view of portions of a workpiece 100 that includes a portion of an NVM array 102 and a portion of a low-voltage region 104 of an electronic device. Although not illustrated, a power transistor and high-voltage transistors in other regions of the electronic device may also be formed. A substrate can include well regions 122 and 124 that can be formed in the NVM array 102 and low-voltage region 104, respectively, and may be formed at the same or a different time as compared to each other and as compared to a well or another doped region within a high-voltage region for the power transistor or the high-voltage transistors or may be formed separate from all of the power transistor or the high-voltage transistors. In still another embodiment, one or both of the well regions 122 and 124 can be portions of an epitaxial layer that are not separately doped. In an embodiment, the well regions 122 and 124 are p-type doped. The well regions 122 and 124 may have the same dopant concentration or different dopant concentrations.

A tunnel dielectric layer 132, a floating gate layer 142, an inter-gate dielectric layer 152, a control gate layer 162, a process-stop layer 172, and a patterned resist layer 182 are formed over a primary surface 110 of the workpiece 100. The tunnel dielectric layer 132 can include an oxide and have a thickness that is sufficiently thin to allow carriers to tunnel across tunnel dielectric layer 132. In an embodiment, the tunnel dielectric layer 132 has a thickness in a range of 2 nm to 15 nm.

The floating gate layer 142 can be conductive and may include a metal or doped semiconductor material. In an embodiment, the floating gate layer 142 can be a heavily doped n-type silicon layer. The floating gate layer 142 can have a thickness in a range from 50 nm to 500 nm. The NVM array 102 can include many different rows and columns of NVM cells. The floating gate layer 142 can be patterned to remove portions of the floating gate layer 142 between different NVM cells, so that the subsequently formed floating gate electrodes are separated from one another along a same row or column.

In another embodiment, the floating gate layer 142 may be replaced by another charge storage layer. For example, the charge storage layer can include a material where a charge can be trapped at a trapping site, for example a silicon nitride. In another example, the charge storage layer can include spaced-apart, discrete conductive elements, such as nano-crystals. Unlike a floating gate electrode, where charge can move within the floating gate electrode, charge remains localized at a trapping site within silicon nitride or within a discrete conductive element. For simplicity, the charge storage layer is described with respect to a floating gate layer.

The inter-gate dielectric layer 152 can include one or more dielectric films that can include an oxide, a nitride, or an oxynitride and be formed after the floating gate layer 142 is patterned for a first time. In an embodiment, the inter-gate dielectric layer 152 can include an oxide film, a nitride film, and another oxide layer, where the nitride film is spaced apart from the floating and control gate layers 142 and the 162 by the oxide films. The control gate layer 162 can include any of the materials previously described with respect to the floating gate layer 142. The control gate layer 162 can have the same or a different composition as compared to the floating gate layer 142. In an embodiment, the control gate layer 162 can include an undoped semiconductor material. The control gate layer 162 can have the same or a different thickness as compared to the floating gate layer 142.

The process-stop layer 172 can be used as a polish-stop or an etch-stop layer. The process-stop layer 172 has a different composition as compared to the control gate layer 162 and one or more layers that will be subsequently formed over the process-stop layer 172. In an embodiment, the process-stop layer 172 includes a nitride. The process-stop layer 172 has a thickness sufficient to protect the control gate layer 162 until the process-stop layer 172 is removed. In an embodiment, the process-stop layer 172 has a thickness in a range of 20 nm to 200 nm. The patterned resist layer 182 covers all of the power transistor and the high-voltage transistor regions, the low-voltage region 104, and portions of the NVM array 102. Openings, such as opening 184, in the patterned resist layer 182 are at locations where the floating gate layer 142, the inter-gate dielectric layer 152, the control gate layer 162, and the process-stop layer 172 are to be removed.

In FIG. 2, exposed portions of the stacks can be removed using an etch sequence. The etch gases can be changed as the composition of the layers change. The etch sequence removes portions of the floating gate layer 142, the inter-gate dielectric layer 152, the control gate layer 162, and the process-stop layer 172. The etch sequence can terminate before etching through the thickness of the tunnel dielectric layer 132. After the etch sequence, floating gate members 242 are formed from the floating gate layer 142, control gate members 262 are formed from the control gate layer 162, and process-stop members 272 are formed from the process-stop layer 172. In another embodiment, the floating gate members 242 can be replaced by other charge storage members (e.g., silicon nitride or discrete conductive elements).

The final shapes of the floating gate electrodes and control gate electrodes are determined in part by the etch sequence. As can be seen in FIG. 2, sides of the layers 142, 152, 162, and 172 are substantially coterminous with one another. Portions of two NVM cells are illustrated in FIG. 2. The patterned resist layer 182 is removed. An optional threshold adjust implant may be performed to achieve a needed or desired threshold voltage associated with a subsequently-formed select gate electrode. An oxide layer (not labelled) can be formed along exposed sidewalls of the floating and control gate members 242 and 262. In another embodiment, the patterned resist layer 182 does not cover the power transistor, the high-voltage transistors, and the low-voltage region 104, and the stack of layers is removed from the power transistor, the high-voltage transistors, and the low-voltage region 104 when defining the stacks for the NVM cells.

Sidewall spacers 342 are formed along the sidewalls of the stacks, as illustrated in FIG. 3. The sidewall spacers 342 can include an insulating material. In an embodiment, the spacers 342 and the process-stop members 272 include different materials. In a particular embodiment, the sidewall spacers 342 can include an oxide, and the process-stop members 272 can include a nitride. The sidewall spacers 342 can be formed by conformally depositing and anisotropically etching an insulating layer. The thickness of the spacers 342 near their bottom surfaces (measured in a direction parallel to the primary surface 110) is sufficient to substantially prevent tunneling of carriers between the floating gate electrodes and select gate electrodes via the sidewall spacers 342. When the sidewall spacers 342 are too thin, dopant may diffuse between the subsequently-formed select and floating gate electrodes. When the sidewall spacers 342 are too thick, the area of the upper surfaces of subsequently-formed select and control gate electrodes may be too small, and contacts to the select and control gates may be difficult or impossible to form without a further complication. In an embodiment, the thickness at the bottoms of the sidewall spacers 342 is in a range from 15 nm to 95 nm. If the stack of layers 142, 152, 162, and 172 has not yet been removed from the power transistor, the high-voltage transistors, and the low-voltage region 104, any remaining portions of such layers can be removed from the power transistor, the high-voltage transistors, and the low-voltage region 104.

A gate dielectric layer for the power transistor or the high-voltage transistors may be formed at this time. Well regions can be formed within the low-voltage region 104. The well regions can include body regions for n-channel and p-channel transistors within the low-voltage region 104. The dopant concentrations of the well regions can be selected to achieve desired threshold voltages of the transistors within the low-voltage region 104. Any remaining portion of the tunnel dielectric layer 132 is removed from the NVM array 102 and the low-voltage region 104.

Figure 4:
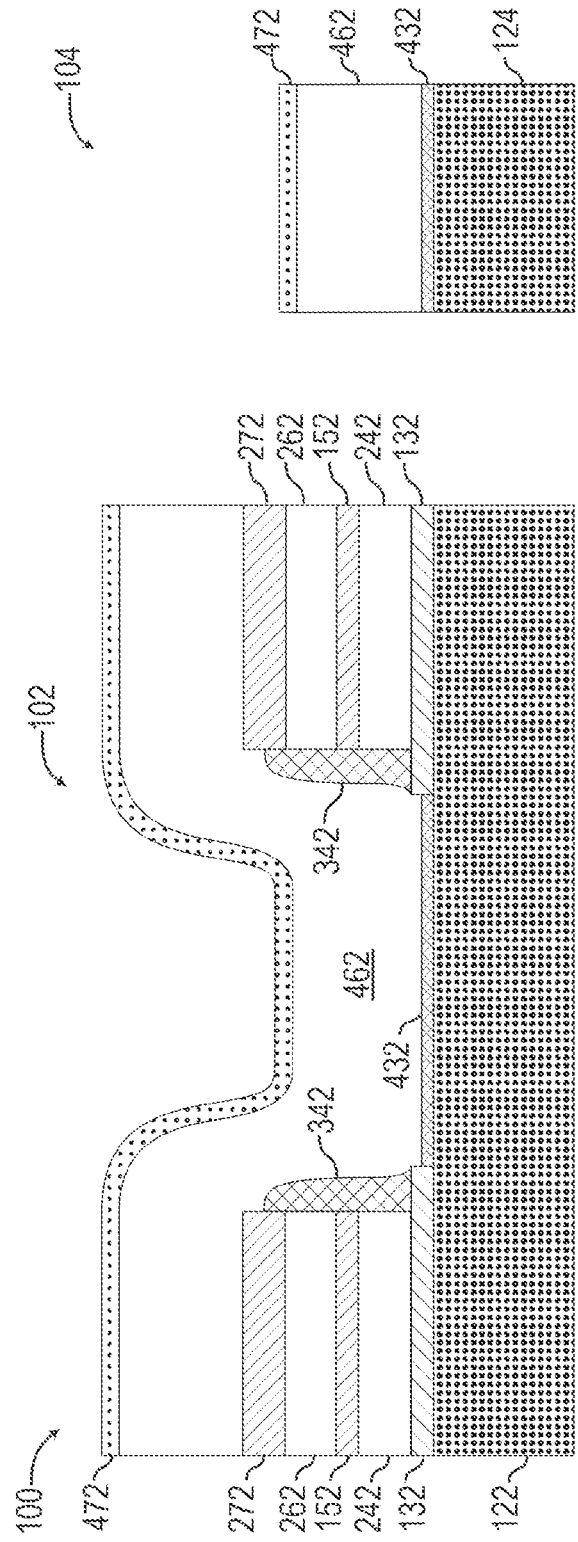
FIG. 4 includes an illustration of cross-sectional views of the workpiece of FIG. 3 after forming a gate electrode layer and a process-stop layer.

A gate dielectric layer 432 can be formed over portions of the NVM array 102 and the low-voltage region 104, as illustrated in FIG. 4. The gate dielectric layer 432 can include an oxide, a nitride, or an oxynitride. The thickness of the gate dielectric layer 432 is selected to allow for a fast read access time for the NVM cells and allow the transistors within the low-voltage region to operate at a sufficiently high frequency. The gate dielectric layer 432 can be thinner than the tunnel dielectric layer 132. In an embodiment, the gate dielectric layer 432 can have a thickness in a range of 2 nm to 90 nm. Other thicknesses may be used if needed or desired.

A gate electrode layer 462 is formed over the exposed surface of the workpiece 100, including the gate dielectric layer for the power transistor or the high-voltage transistors and the gate dielectric layer 432. The gate electrode layer 462 can have the same or a different composition as compared to the control gate layer 162. In an embodiment, the gate electrode layer 462 as originally formed can include an undoped semiconductor material. The gate electrode layer 462 can have the same or a different thickness as compared to the control gate layer 162.

Figure 5:
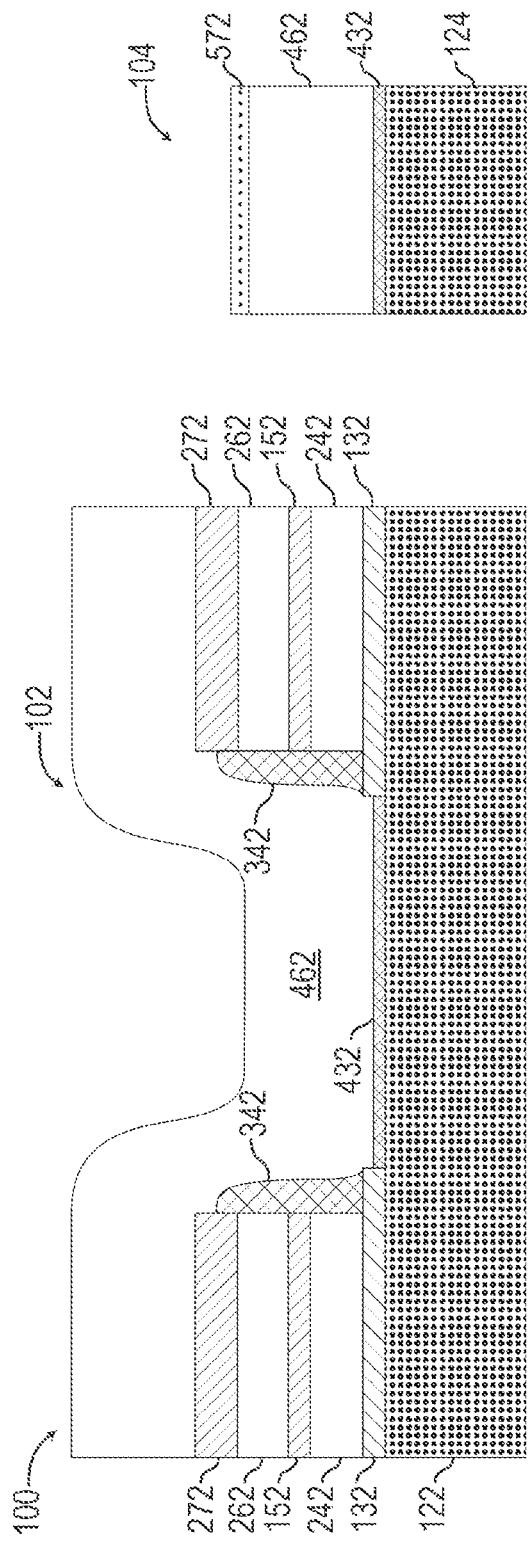
FIG. 5 includes an illustration of cross-sectional views of the workpiece of FIG. 4 after removing a portion of the process-stop layer within the nonvolatile member array.

A process-stop layer 472 is formed over the gate electrode layer 462. The process-stop layer 472 can be used as a polish-stop or an etch-stop layer. The process-stop layer 472 has a different composition as compared to the gate electrode layer 462. The process-stop layer 472 can have the same or a different composition as compared to the process-stop layer 172. The process-stop layer 472 can have the same or a different thickness as compared to the process-stop layer 172. The portion of the process-stop layer 472 over the NVM array 102 is removed to define process-stop members, including process-stop member 572 in FIG. 5, that overlie the power transistor, the high-voltage transistors, and the low-voltage region 104. Thus, the process-stop member 572 does not cover the floating gate members 242, the control gate members 262, and process-stop members 272.

Figure 6:
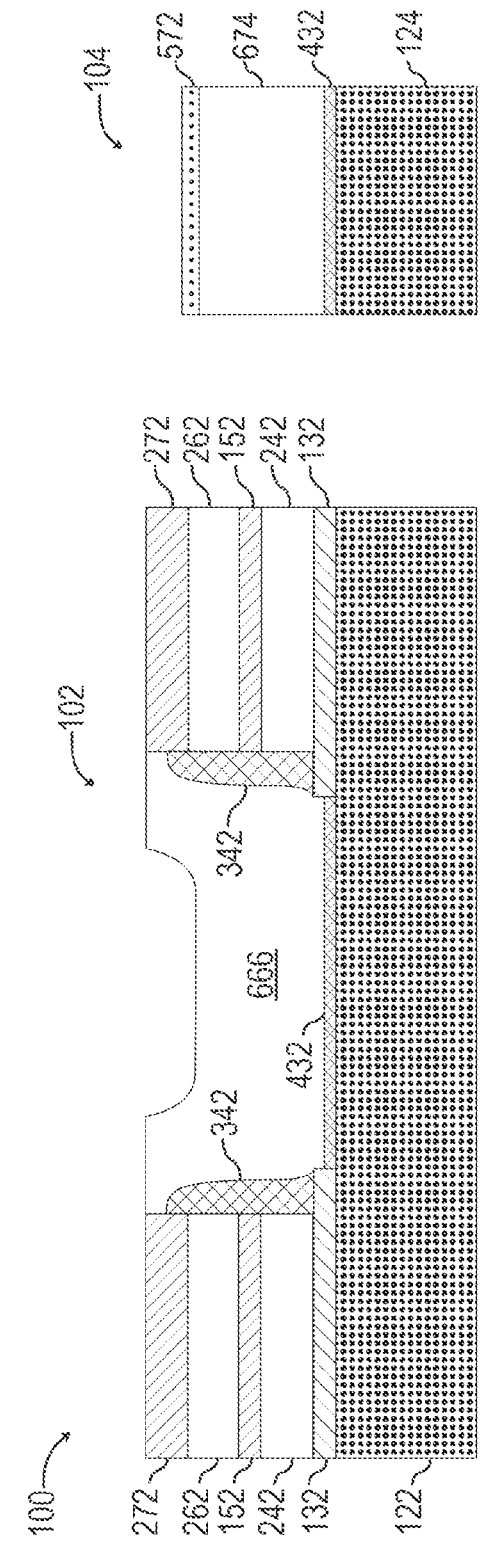
FIG. 6 includes an illustration of cross-sectional views of the workpiece of FIG. 5 after removing portions of the gate electrode layer overlying the gate stacks.

Portions of the gate electrode layer 462 lying at elevations higher than the process-stop members 272 are removed, as illustrated in FIG. 6. In an embodiment, chemical-mechanical polishing is performed to remove such portions of the gate electrode layer 462. The polishing can be performed to stop on the process-stop members 272 and 572. In another embodiment, a resist etch-back process can be performed. The etch can be performed until the process-stop members 272 and 572 are exposed. After the removal, portions of the gate electrode layer 462 that remain between the stacks within the NVM array 102 are select gate members, including select gate member 666, that will be subsequently patterned to form select gate electrodes in the finished device. The gate member 674 lies outside the NVM array 102 and will be subsequently patterned to form gate electrodes for the power transistor, the high-voltage transistors, and transistors within the low-voltage region 104.

FIG. 7 illustrates a cross-sectional view of the workpiece 100 after removing the process stop members 272 and 572 and forming optional spacers 766. The spacers 766 can help subsequently-formed silicide members associated with the control and select gate members 262 and 666 from bridging. Similar to the sidewall spacers 342, the spacers 766 are formed by conformally depositing an insulating layer and anisotropically etching the insulating layer. As deposited, the thickness of the insulating layer is in a range from 10 nm to 20 nm.

The control and select gate members 262 and 666 and portions of the gate member 674 can be heavily doped. In an embodiment, the portion of the gate member 674 corresponding to p-channel transistors can be doped with a p-type dopant, and the control and select gate members 262 and 666 and remaining portions of the gate member 674 can be n-type doped.

A hard mask layer is deposited and patterned to form hard mask members 862 within the NVM array 102 and a hard mask member 864 that covers portions of the workpiece 100 outside the NVM array 102, as illustrated in FIG. 8. In an embodiment, the hard mask layer can include a nitride material. The hard mask members 862 correspond to shapes of the stacks and select gate electrodes within the NVM array 102.

In FIG. 9, a patterned resist layer is formed and includes resist members, including the resist member 982, within the NVM array 102 and a resist member 984 that covers portions of the workpiece 100 outside the NVM array 102. The combination of the hard mask members 862 and resist members, including the resist member 982, protect the select gate members, including the select gate member 666. An etch sequence is performed to remove portions of the floating gate members 242, the inter-gate dielectric layer 152, and the control gate members 262. Floating gate electrodes 942 and control gate electrodes 962 are formed from the floating and control gate members 242 and 262, respectively. Each of the floating and control gate electrodes 942 and 962 have an opposite pair of sides that are formed at different times. The sides closer to the select gate member 666 are defined relatively early in the process and before forming the select gate member 666, and the sides farther from the select gate member 666 are defined relatively later in the process and after the select gate member 666 is formed. In the embodiment as illustrated in FIG. 9, the sides of the floating gate electrodes 942 are coterminous with the sides of the control gate electrodes 962. In a further embodiment, the floating gate electrodes 942 may be replaced by another charge storage member.

A source/drain implant can be performed to dope portions of the NVM array 102 adjacent to the floating gate electrodes 942. The resist members 982 and 984 are removed. An anneal can be performed to activate the dopant within the source/drain regions 1026 in FIG. 10. A thin oxide layer can be formed along the exposed surfaces of the floating and control gate electrodes 942 and 962 to protect the floating and control gate electrodes 942 and 962 during subsequent processing.

In FIG. 11, a patterned resist layer is formed and includes resist members 1182 within the NVM array 102 and a resist member 1184 that covers portions of the workpiece 100 outside the NVM array 102. The combination of the hard mask members 862 and resist members 982 protects the source/drain regions 1026 and portions of the floating gate electrodes 942, control gate electrodes 962, and the select gate members, including the select gate member 666. An etch sequence is performed to remove portions of the select gate members, including select gate member 666, to form from the select gate members 1166. A drain/source implant can be performed to dope portions of the NVM array 102 adjacent to the select gate electrodes 1166. The resist members 1182 and 1184 are removed.

As illustrated in FIG. 11, the lengths of the hard mask members 862 are larger than the lengths of the select gate electrodes 1166 and the lengths of the gate stacks, which include the floating and control gate electrodes 942 and 962. Thus, the hard mask members 862 can allow the floating, control, and select gate electrodes 942, 962, and 1166 to have lengths that are less than a resolution limit of a lithography tool used to define the hard mask members 862. Thus, the process sequence as described herein allows the NVM cell to be smaller as compared to a conventional process sequence.

FIG. 12 includes a cross-sectional view of the workpiece 100 after formation of NVM cells and transistor structures outside the NVM array 102. An anneal can be performed to activate the dopant from the drain/source implant to form the drain/source regions, including the drain/source region 1222 in FIG. 12. Optional thin oxide spacers can be formed along the exposed surfaces of the nitride film of the inter-gate dielectric layer 152. The hard mask members 862 and 864 (seen in FIG. 11) are removed. The optional-thin oxide spacers can help protect the nitride film of the inter-gate dielectric layer 152 when the hard mask members 862 and 864 are removed. Optional thin spacers may be formed along the sides of the floating, control, and select gate electrodes 942, 962, and 1166 to protect the electrodes during subsequent processing.

The gate member 674 (seen in FIG. 11) is patterned to form gate electrodes for the power transistor, the high-voltage transistors, and transistors within the low-voltage region 104. FIG. 12 includes a gate electrode 1274 within the low-voltage region 104. Doping for source and drain regions for the power transistor or the high-voltage transistors can be performed. The NVM array 102 and the low-voltage region 104 may be covered by a patterned resist layer for doping operations that are performed for the power transistor or the high-voltage transistors. Source regions, drain regions, or both source and drain regions for the power transistor or the high-voltage transistors can be formed from dopant introduced during the doping operations. The patterned resist layer can be removed after doping operations for the power transistor or the high-voltage transistors. A thin oxide layer 1232 may be deposited over exposed portions of the workpiece 100.

Doping operations may be used in forming doped regions for transistors within the low-voltage region 104. Referring to FIG. 12, depending on the biasing conditions, the doped regions 1252 can be a drain region or a source region, and the doped region 1256 can be the other of a drain region or a source region. The power transistor, the high-voltage transistors, and NVM array 102 may be covered by one or more patterned resist layers during doping operations for the transistors in the low-voltage region 104. Nitride spacers 1276 can be formed along sides of the floating, control, and select gate electrodes 942, 962, and 1166 and along the gate electrodes of the power transistor, the high-voltage transistors, and transistor structures within the low-voltage region 104.

Portions of the thin oxide layer 1232 that are not covered by the nitride spacers 1276 are removed and silicide members are formed. Within the NVM array 102, silicide members 1262 overlie the control gate electrodes 962, silicide members 1266 overlie the select gate electrodes 1166, a silicide member 1282 overlies the drain/source region 1222, and silicide members 1286 overlie the source/drain regions 1026. In an embodiment, the spacers 766 can help to keep the silicide members 1262 and 1266 from electrically shorting or forming a significantly leakage current path between such silicide members. In the low voltage region 104, a silicide member 1292 overlies the doped region 1252, a silicide member 1294 overlies the gate electrode 1274, and a silicide member 1296 overlies the doped region 1256. Many other silicide members can be formed and are not illustrated in FIG. 12.

Figure 13:
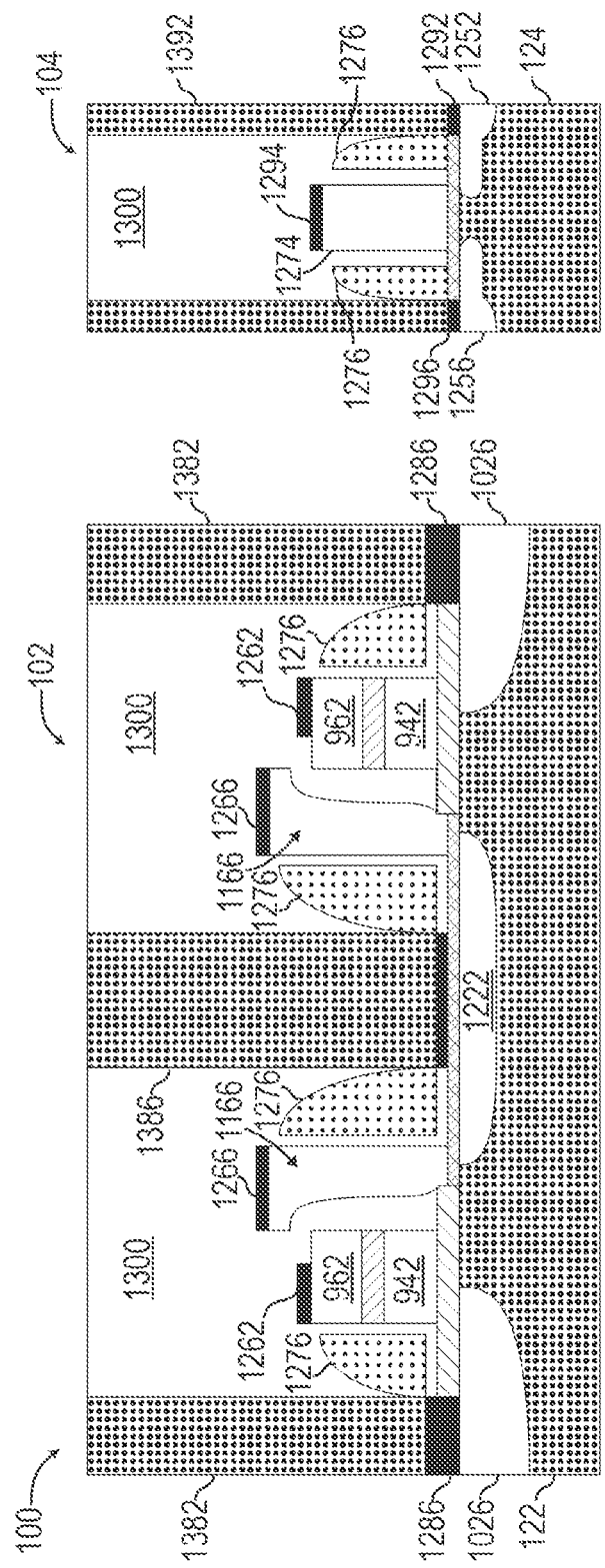
FIG. 13 includes an illustration of cross-sectional views of the workpiece of FIG. 12 after forming a substantially completed electronic device in accordance with an embodiment.

FIG. 13 includes a cross-sectional view of a substantially completed electronic device. In an embodiment, an inter-level dielectric (ILD) layer 1300 can be formed over the workpiece 100. The ILD layer 1300 can include an oxide, a nitride, an oxynitride, or any combination thereof. The ILD layer 1300 can be deposited to a thickness in a range of approximately 0.5 micron to approximately 2.0 microns. Portions of the ILD layer 1300 are patterned to define contact openings. A conductive layer can be formed within the contact openings and over the ILD layer 1300 and etched or polished to form conductive plugs 1382, 1386, 1392, and 1396. Other contact openings and conductive plugs can be formed for the control and select gate electrodes 962 and 1166, the gate electrode 1274, the power transistor, the high-voltage transistors, and other portions of the NVM array 102 and low-voltage region 104. Although not illustrated, one or more interconnect levels and a passivation layer may be formed over the workpiece 100. Each interconnect level can include an interlevel dielectric layer and interconnects. The passivation layer can be formed over the uppermost interconnect level and patterned to expose bond pads. A polyimide or other protective layer may be formed over the passivation if needed or desired for a particular application.

NVM cells within the NVM array 102 may be programmed using hot carrier injection and erased by tunneling. In an embodiment, the hot carrier injection can be hot electron injection, and tunneling can be Fowler-Nordheim tunneling. Below is a table of voltages that can be used to read, program, and erase an NVM cell within the NVM array 102.

TABLE 1

Read, program, and erase voltages

| Region or electrode | Read | Program | Erase |
|---|---|---|---|
| Source/drain region 1026 | 0 V | 3.0 to 5.0 V | 3.0 to 6.0 V |
| Control gate electrode 962 | 0 to 2.0 V | 8.0 to 12.0 V | −8.0 to −12.0 V |
| Select gate electrode 1166 | 0.3 V to $V_{DD}$ | 0.5 to 1.5 V | 0 V or float |
| Drain/source region 1222 | 0.3 V to $V_{DD}$ | 0 to 1.0 V | 0 V or float |
| Body region (well region 122) | 0 V | 0 V | 0 V |

Some voltages during programming and erasing are addressed to understand better some of the features of the NVM array 102. With respect to reading, $V_{DD}$ is the drain voltage used in the low-voltage region 104 that may or may not be the same as the drain voltage for the power transistor or the high-voltage transistors.

During programming, a current source may be coupled to the drain/source region 1222, and the drain/source region 1222 can be at a higher voltage than the body region. In an embodiment, the voltage of the drain/source region 1222 can be in a range from 0.5 V to 1.0 V. The voltage on the select gate electrode 1166 can control the current flowing from the source/drain region 1026 to the drain/source region 1222. A higher voltage on the select gate electrode 1166 results in a higher current, and a lower voltage on the select gate electrode 1166 results in a lower current. During programming, electrons flow from the drain/source region 1222, and hot electrons are generated within the well region 122 near the gap between the floating and select gate electrodes 942 and 1166, some of which are injected into the floating gate electrode 942 because of the voltage applied to the control gate electrode 962.

In an embodiment, during erasing, the voltage difference between the control gate electrode 962 and the source/drain region 1026 is greater than (1) the voltage difference between the control gate electrode 962 and the select gate electrode 1166 and (2) the voltage difference between the control gate electrode 962 and the body region. Thus, electrons tunnel from the floating gate into the source/drain region 1026. In an embodiment, none or an insignificant number of electrons are injected into either or both of the select gate electrode 1166 and into the body. Thus, the spacing between the control gate electrode 962 and the select gate electrode 1166 may be smaller as compared to an embodiment in which the voltage on the source/drain region 1026 and select electrode 1166 would have been the same. Further, damage to the portion of tunnel dielectric layer 132 in contact with the body region during erasing is significantly reduced.

In another embodiment, during erasing, the source/drain region 1026, the well region 122, and the drain/source region 1222 are at 0 V, and the control gate electrode is at a voltage in a range from −15 V to −20 V. In this embodiment, significant numbers of electrons are injected into the source/drain region 1026 and the well region 122. None or an insignificant number of electrons are injected into the drain/source region 1222 and either or both of the select gate electrode 1166 when the sidewall spacer 342 has a thickness of at least 25 nm. This embodiment can allow more flexibility in the design of the source/drain region 1026 and allow the size of the bit cell to be further reduced.

In another embodiment, the floating gate electrode 942 is replaced by a silicon nitride member or spaced-apart, discrete conductive members, both of which has charged localized. Different biasing may be used when erasing (removing charge from) the silicon nitride member or spaced-apart, discrete conductive members. For example, the source/drain region 1026, the drain/source region 1222, and body (well region 122) may be at 0 V, and the control gate electrode may be at −15 V to −20 V. The select gate electrode 1166 can be at 0 V or electrically float.

Many other embodiments can be used with the concepts as described herein. The conductivity types can be reversed for the NVM cell. Further, the floating gate electrode or other charge storage member can be programmed and erased with holes instead of electrons. The low-voltage region 104 can include n-channel insulated gate field-effect transistors (IGFETs), p-channel IGFETs, npn bipolar transistors, pnp bipolar transistors, or any combination thereof.

As previously described, the power transistor is an LDMOS transistor. U.S. Ser. No. 10/153,213 describes a power transistor and is incorporated by reference in its entirety. In another embodiment, the power transistor can be a vertical IGFET or an IGBT. Gate electrodes for the vertical IGFET or the IGBT may be within trenches. Processing used for forming the drift region and drain region and patterning the gate electrode using a resist member may not be needed for a vertical IGFET or IGBT. Furthermore, more than one power transistor may be used. For example, an energy converter, such as a buck converter or voltage regulator, may include more than one power transistor.

The NVM array with NVM cells such as those previously described can be used with a high-voltage transistor. Exemplary high-voltage transistors are described in US 2016/0126237, which is incorporated herein by reference regarding its disclosure of high-voltage transistors. One or more high-voltage transistors can be used for programming or erasing the NVM cells. In an embodiment, a current for the high-voltage transistors used for programming or erasing the NVM cells is less than a current for a power transistor when the power transistor is in an on-state. In another embodiment, a high-voltage transistor may also be the power transistor. Energy convertors can include a high-side transistor and a low-side transistor, where each of the high-side and low-side transistors are high-voltage, power transistors.

Accordingly, after reading this specification, skilled artisans will appreciate that many combinations of power and low-voltage transistors can be used in conjunction with the NVM cells of the NVM array.

Embodiments as described herein are well suited to process flows for electronic devices that include power transistors, high-voltage transistors, and low-voltage transistors. The NVM cells as described herein do not have a separate, dedicated erase electrode. Thus, the cell size of the NVM cells can be kept reasonably small. The gate stacks that include the floating and control gate electrodes can be patterned using a nitride hard mask that can help to reduce floating gate-to-select gate misalignment and gate lengths of the gate electrodes within the NVM cell. A thin spacer between the gate stacks and the select gate electrode can further help to reduce the NVM cell size. The select gate members and a conductive member (used for gate electrodes outside the NVM array) can be formed using a CMP or resist-etch back process. In an embodiment, the select gate members can be patterned to form select gate electrodes that do have a characteristic spacer (half-parabola) shape. As compared to a spacer shape for the select gate electrode, silicide members may be formed along an upper surface of the select gate electrode using a process as previously described with a reduced likelihood of bridging to silicide members over adjacent doped regions within a substrate (e.g., drain/source regions). Optional spacers near tops of the control and select gate electrodes can help to reduce the likelihood of bridging between silicide members over the control and select gate electrodes.

In an embodiment, the process flow as described herein allows the gate dielectric layer under the select gate electrodes of the NVM cells to be formed during the same operation when forming the gate dielectric layer for the low-voltage transistors. Thus, the NVM cells can have a faster read access time, such as less than 10 ns, as compared to using the relatively thicker tunnel dielectric layer under the select gate electrode. Erasing can be performed by tunneling charge between the floating gate electrode and the source/drain region. Substantially no or less charge passes through portions of the tunnel dielectric and gate dielectric layer into the body that is between the drain/source and source/drain regions. Such an erasing scheme may allow for less degradation of the dielectric layers and allow the NVM cells to withstand more program/erase cycles, as compared with other NVM cells where significant tunneling occurs between the floating gate electrode and the body region.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. A process of forming an electronic device can include forming a first gate member over a substrate; forming a first process-stop member over the first gate member; forming a gate electrode layer over the first gate member, the first process-stop member, and a portion of the substrate not covered by the first gate member and the first process-stop member; forming a second process-stop member over the gate electrode layer, wherein the second process-stop does not cover the first gate member and first process-stop member; and removing a portion of the gate electrode layer to expose the first process-stop member to form a second conductive member that does not contact the first gate member.

Embodiment 2. The process of Embodiment 1 further includes patterning the second conductive member to form a gate electrode for a low-voltage transistor.

Embodiment 3. The process of Embodiment 1 further includes:
 forming a charge storage member;
 patterning the first gate member to define a control gate electrode; and
 patterning the second gate member to define a select gate electrode.

Embodiment 4. The process of Embodiment 3 further includes forming a sidewall spacer along a side of the first gate member, wherein forming the sidewall spacer is performed before forming the gate electrode layer, Embodiment 5. The process of Embodiment 3 further includes removing the first process-stop member and forming a sidewall spacer over the control gate member and adjacent to a side of the select gate member.

Embodiment 6. The process of Embodiment 5 further includes forming a first silicide member over the control gate electrode and forming a second silicide member over the select gate electrode, wherein the sidewall spacer reduces the likelihood of bridging between the first silicide member and the second silicide member.

Embodiment 7. The process of Embodiment 3 further includes patterning the second gate member to define a gate electrode of a transistor that is outside of a nonvolatile memory array.

Embodiment 8. The process of Embodiment 7 further includes forming a gate dielectric layer over exposed portions of the substrate before forming the gate electrode layer.

Embodiment 9. The process of Embodiment 3 further includes forming a tunnel dielectric layer before forming the charge storage member.

Embodiment 10. The process of Embodiment 3 further includes forming a floating gate layer; forming an oxide-nitride-oxide layer over the floating gate layer; forming a control gate layer; patterning the floating gate layer and the control gate layer to define a side of the floating gate electrode and a side of the control gate electrode, wherein a portion of the oxide-nitride-oxide layer becomes exposed when patterning the floating gate layer and the control gate layer; forming an oxide spacer adjacent to the portion of the oxide-nitride-oxide layer; and removing the first process-stop member after forming oxide spacer.

Embodiment 11. The process of Embodiment 3 further includes forming a charge storage layer; forming a control gate layer; patterning the charge storage layer and the control gate layer to define a charge storage member and a control gate member, wherein the charge storage member includes a first side of the charge storage member, and the control gate member includes a first side of a control gate member; patterning the charge storage member and the control gate member to define a second side of the charge storage member and a second side of the control gate electrode. Patterning to define the first sides can be performed before forming the gate electrode layer, and patterning to define the second sides can be performed after forming the gate electrode layer.

Embodiment 12. An electronic device can include a nonvolatile memory cell. The nonvolatile memory cell can include a drain/source region; a source/drain region; a charge storage member that is closer to the source/drain region than to the drain/source region; a control gate electrode overlying the charge storage member; a first silicide member overlying the control gate electrode; a select gate electrode that is closer to the drain/source region than to the source/drain region; a second silicide member overlying the select gate electrode; and a spacer that is disposed between the first silicide member and the second silicide member.

Embodiment 13. The electronic device of Embodiment 12, wherein the nonvolatile memory cell does not have a dedicated, separate erase electrode.

Embodiment 14. The electronic device of Embodiment 12, wherein the nonvolatile memory cell further includes a tunnel dielectric layer underlying the charge storage member; and a first gate dielectric layer underlying the select gate electrode, wherein the first gate dielectric layer is thinner than the tunnel dielectric layer. The electronic device further includes a transistor including a second gate dielectric layer that is thicker than the first gate dielectric layer, wherein the transistor is a power transistor or a high-voltage transistor.

Embodiment 15. The electronic device of Embodiment 12 further includes a transistor including a gate electrode, wherein the transistor is outside a nonvolatile memory array, and a height of the select gate electrode is greater than thickness of the gate electrode of the transistor.

Embodiment 16. The electronic device of Embodiment 12 further includes a body region disposed between the drain/source region and the source/drain region.

Embodiment 17. A process of forming an electronic device can include forming a first gate member over a substrate, wherein the first gate member has a proximal side; forming a second gate member having a proximal side adjacent to the proximal side of the first gate member; forming a mask member over portions of the first gate member and the second gate member, wherein the mask member overlies the proximal sides of the first gate member and the second gate member; removing an exposed portion of the first gate member that is not covered by the mask member to form a first gate electrode having a distal side that is opposite the proximal side; and removing an exposed portion of the second gate member that is not covered by the mask member to form a second gate electrode having a distal side that is opposite the proximal side.

Embodiment 18. The process of Embodiment 17 further includes forming an insulating sidewall spacer after forming the first gate member and before forming the second gate member.

Embodiment 19. The process of Embodiment 17 further includes forming a charge storage member having a proximal side before forming the first gate member; and removing a portion of the charge storage member that is not covered by the mask member, wherein after removing the portion, a remaining portion of the charge storage member has a distal side that is opposite the proximal side. In a finished device, the proximal sides of charge storage member, the first gate electrode, and the second gate electrode are adjacent to one another, and the distal sides of the charge storage member and the first gate electrode are adjacent to each other, and the first gate electrode is a control gate electrode, and the second gate electrode is a select gate electrode.

Embodiment 20. The process of Embodiment 19, wherein removing the exposed portion of the first gate member and removing the portion of the charge storage member are performed during a same etching sequence, and removing the exposed portion of the second gate member is performed during a different etch sequence.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   forming a first gate member over a substrate;
   forming a first process-stop member over the first gate member;
   forming a gate electrode layer over the first gate member, the first process-stop member, and a portion of the substrate not covered by the first gate member and the first process-stop member;
   forming a second process-stop member over the gate electrode layer, wherein the second process-stop member does not cover the first gate member and the first process-stop member; and
   removing a portion of the gate electrode layer to expose the first process-stop member to form a second gate member that does not contact the first gate member, wherein removing the portion of the gate electrode layer is performed by a planarization technique selected from the group consisting of chemical-mechanical polishing and a resist etch-back process.

2. The process of claim 1, further comprising patterning the second gate member to form a gate electrode for a low-voltage transistor.

3. The process of claim 1, further comprising:
   forming a charge storage member;
   patterning the first gate member to define a control gate electrode; and
   patterning the second gate member to define a select gate electrode.

4. The process of claim 3, further comprising forming a sidewall spacer along a side of the first gate member, wherein forming the sidewall spacer is performed before forming the gate electrode layer.

5. The process of claim 3, further comprising removing the first process-stop member and forming a sidewall spacer over the control gate electrode and adjacent to a side of the select gate electrode.

6. The process of claim 5, further comprising forming a first silicide member over the control gate electrode and forming a second silicide member over the select gate electrode, wherein the sidewall spacer reduces the likelihood of bridging between the first silicide member and the second silicide member.

7. The process of claim 3, wherein:
   removing the portion of the gate electrode layer further forms a third gate member, and
   the process further comprises patterning the third gate member to define a gate electrode of a transistor that is outside of a nonvolatile memory array.

8. The process of claim 7, further comprising forming a gate dielectric layer over exposed portions of the substrate after forming the first gate member and before forming the gate electrode layer.

9. The process of claim 3, further comprising forming a tunnel dielectric layer before forming the charge storage member.

10. The process of claim 3, wherein the charge storage member is a floating gate member, the process further comprising:
  forming an oxide-nitride-oxide layer, wherein after forming the floating gate member and the first gate member, the oxide-nitride-oxide layer is disposed between the floating gate member and the first gate member, and the first gate member is a control gate member;
  forming a third process-stop member over the control gate member, wherein the third process-stop member includes a nitride;
  patterning the floating gate member and the control gate member to define a side of a floating gate electrode and a side of the control gate electrode, wherein a portion of the oxide-nitride-oxide layer becomes exposed when patterning the floating gate member and the control gate member;
  forming an oxide spacer adjacent to the portion of the oxide-nitride-oxide layer; and
  removing the third process-stop member after forming the oxide spacer.

11. The process of claim 3, wherein:
  forming the charge storage member comprises:
    forming a charge storage layer; and
    patterning the charge storage layer to define a first side of the charge storage member,
  forming the first gate member comprises:
    forming a control gate layer; and
    patterning the control gate layer to define a first side of a control gate member, wherein the control gate member is the first gate member,
  the process further comprises:
    patterning the control gate member to define a second side of the control gate electrode; and
    patterning the charge storage member to define a second side of the charge storage member, and
  patterning the charge storage layer and patterning the control gate layer are performed before forming the gate electrode layer, and patterning the control gate member and patterning the charge storage member are performed after forming the gate electrode layer.

12. The process of claim 1, wherein removing the portion of the gate electrode layer comprises chemical-mechanical polishing the gate electrode layer.

13. A process of forming an electronic device comprising:
  forming a control gate member over a substrate, wherein the control gate member has a proximal side;
  forming a charge storage member having a proximal side, wherein after forming the charge storage member and the control gate member, the charge storage member is disposed between the substrate and the control gate member;
  forming a select gate member having a proximal side adjacent to the proximal side of the control gate member;
  forming a mask member over portions of the control gate member and the select gate member, wherein the mask member overlies the proximal sides of the control gate member and the select gate member;
  removing an exposed portion of the control gate member that is not covered by the mask member to form a control gate electrode having a distal side that is opposite the proximal side;
  removing a portion of the charge storage member that is not covered by the mask member, wherein after removing the portion of the charge storage member, a remaining portion of the charge storage member has a distal side that is opposite the proximal side; and
  removing an exposed portion of the select gate member that is not covered by the mask member to form a select gate electrode having a distal side that is opposite the proximal side,
  wherein:
    in a finished device, the proximal sides of charge storage member, the control gate electrode, and the select gate electrode are adjacent to one another, and the distal sides of the charge storage member and the control gate electrode are adjacent to each other,
    removing the exposed portion of the control gate member and removing the portion of the charge storage member are performed during a same etching sequence, and
    removing the exposed portion of the select gate member is performed during a different etch sequence.

14. The process of claim 13, further comprising forming an insulating sidewall spacer after forming the control gate member and before forming the select gate member.

15. A process of forming an electronic device comprising:
  forming a control gate layer over a substrate;
  forming a first process-stop member over the control gate layer;
  patterning the control gate layer to form a control gate member having a first side;
  forming a gate dielectric layer over the substrate after patterning the control gate layer;
  forming a gate electrode layer over the gate dielectric layer, wherein the gate electrode layer contact the gate dielectric layer;
  forming a second process-stop member over a portion of the gate electrode layer; and
  removing a portion of the gate electrode layer to form a first gate member and a second gate member, wherein the gate dielectric layer is not exposed within a non-volatile memory array when the first gate member and the second gate member are formed; and
  patterning the control gate member to form a control gate electrode having a first side and a second side opposite the first side of the control gate electrode, wherein patterning the control gate member is performed after patterning the control gate layer.

16. The process of claim 15, wherein:
  the first side of the control gate electrode is formed during patterning the control gate layer to form the control gate member, and
  the second side of the control gate electrode is formed during patterning the gate control member to form the control gate electrode.

17. The process of claim 15, further comprising:
  forming an inter-gate dielectric layer;
  forming a second process-stop member over the control gate member;
  etching the inter-gate dielectric layer, wherein after etching, the inter-gate dielectric layer has an exposed sidewall, and the control gate member is disposed between the inter-gate dielectric layer and the second process-stop member;

forming a sidewall spacer along the exposed sidewall of the inter-gate dielectric layer; and removing the second process-stop member after forming the sidewall spacer.

18. The process of claim 17, wherein the second process-stop member and the inter-gate dielectric layer includes a nitride, and the sidewall spacer includes an oxide.

19. The process of claim 15, further comprising:

patterning the first gate member to form a select gate electrode within the nonvolatile memory array; and patterning the second gate member to form a gate electrode of a transistor outside the nonvolatile memory array.

* * * * *